United States Patent [19]

Mii

[11] Patent Number: 4,949,156

[45] Date of Patent: Aug. 14, 1990

[54] SEMICONDUCTOR STRING CONNECTION STRUCTURE

[76] Inventor: Adam Mii, 3Fl., No. 1, Fu Hsing N. Rd., Taipei, Taiwan

[21] Appl. No.: 154,588

[22] Filed: Feb. 10, 1988

[51] Int. Cl.$^5$ ............................................. H01L 23/48
[52] U.S. Cl. ....................................... 357/68; 357/70; 357/65
[58] Field of Search ............................. 357/70, 68, 65

Primary Examiner—Andrew J. James
Assistant Examiner—Mark Prenty

[57] ABSTRACT

A semiconductor string connection structure comprising a plurality of encasements, each of which has a light emitting diode chip and a pair of conducting leads, a plurality of binding pieces connected between the encasements, a plurality of longitudinal pieces disposed between two pairs of the conducting leads or at the right-most or left-most side thereof, a plurality of transverse thin pieces connected with the leads and longitudinal pieces, and a transverse plate disposed and connected with lower ends of the leads and longitudinal piece. The transverse plate serves as a common line, therefore, the lower half of the semiconductor string connection structure is folded 180 degrees such that the whole structure can be mounted on a circuit board to form a large display.

5 Claims, 6 Drawing Sheets 4,949,156

1

SEMICONDUCTOR STRING CONNECTION STRUCTURE

BACKGROUND OF THE INVENTION

This invention relates to a semiconductor string connection structure, and more specifically, to a light emitting diode (LED) string structure which can be used for a display board or the like. When manufacturing the LEDs, the lead frame of the LED is specially constructed in order to increase its utility ratio. After the LEDs are finished, the LEDs are connected to form a string structure and the common leads of the LEDs are connected with a transverse plate such that a plurality of LEDs can be conveniently positioned to a circuit board, thereby not only decreasing the number of connecting pins of the printed circuit board but also simplifying the design of the printed circuit boards.

As disclosed in prior art, LEDs have often been formed as a single element. When used to form a large display, it has been necessary to position all of the single LED elements on a circuit board and make necessary electrical connections. However, this arrangement has two major drawbacks:
1. It takes a lot of time to assemble single elements into a large display and is therefore inefficient for use in forming such a display.
2. The circuit board used to position every LED thereon is very complicated in its circuit layout. For example, if there are 400 LEDs on the board, then it is necessary to connect 800 pins into a desired matrix form and to align these LEDs in a correct position, obviously difficult and expensive. Moreover, it is very difficult to connect so many pins on a one-layer circuit board, of course, the cost of manufacturing is greatly increased.
3. All the LED elements can not be easily aligned with each other. Generally most LED elements are somewhat tilted, so that the convergence effect of encasement is reduced.

It is, therefore, the purpose of this invention to mitigate and/or obviate the above-mentioned drawbacks in the manner set forth in the detailed description of the preferred embodiment.

SUMMARY OF THE INVENTION

A primary objective of this invention is to provide an LED string connection structure which greatly reduces the number of pins which must be connected during assembly of a large number of LEDs into a large display Another objective of this invention is to provide an LED string connection structure which easily keeps all the LED elements, positioned on a printed circuit board at the same level. Further, all the LED elements of each string are aligned, so that the convergence effect of encasements can be greatly increased.

Further objectives and advantages of this invention will become apparent as the following description proceeds.

DETAILED DESCRIPTION OF THE PREFERRED EMBODIMENT

Figure 1:
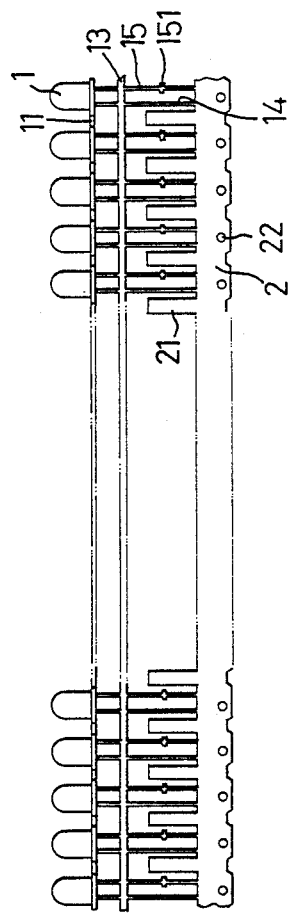
FIG. 1 is a plan view of the present invention in an unfolded position.

Referring to FIG. 1, a plurality of encasements 1 can be seen. Each encasement 1 has a chip therein soldered by a bonder to the ends of respective pairs of conducting leads 14, 15, which project from one end thereof. Each lead 15 has a stop piece 151. All the stop pieces 151 are arranged at the same level. At the other ends of each of the pairs of conducting leads 14, 15 is disposed a transverse piece 2 therewith thus forming a connection between all the conducting leads 14, 15 of a plurality of light emitting diode (LED) elements. A plurality of binding pieces 11 are respectively formed between each of the encasements 1 in order to secure the encasements and prevent them from displacing with respect to each other.

Between each of the conducting leads 14, 15, there are disposed a plurality of longitudinal pieces 21. In addition, a transverse thin piece 13 is also arranged between each of the leads 14 and 15 or between the lead 14 or 15 and the longitudinal pieces 21 so as to make the whole construction more stable. The transverse plate 2, longitudinal pieces 21, connecting leads 14, 15, transverse thin pieces 13 and binding pieces 11 form a so-called "lead frame". A plurality of positioning holes 22 are provided on the transverse plate 2 so as to facilitate the automatic manufacturing process. Please note that the transverse plate 2 is wide enough to be folded as described hereinafter. It is obvious that the transverse thin pieces 13 and binding pieces 11 may be suitably cut away to form the LEDs.

Figure 2:
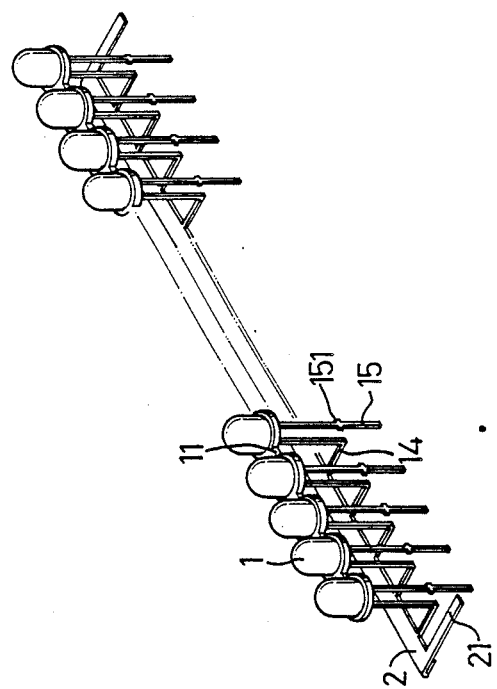
FIG. 2 is a perspective view of the present invention in a halfway folded position.

When forming the structure of this invention, referring to FIG. 2, every connecting lead 15 is cut away from connection with transverse plate 2. However, the other connecting leads 14 are still connected with the transverse plate. The transverse thin pieces 13 and longitudinal pieces 21, except the right-most and left-most ones, are cut away from the structure of this invention. Then the lower half of the structure is folded to bend 90 degrees, as shown in FIG. 2. Another 90 degree fold results in the final structure of this invention, as FIGS. 3A and 3B indicate. Referring to FIG. 4, the leads 14 may be folded 180 degrees directly. That is, the connecting leads 14 are folded so that the ends of the longitudinal pieces 21 face away from the encasements 1. The remaining longitudinal pieces 21 can be varied as desired, for example, the middle one can also be left. The structure of the present invention allows for easy selection of a desired number of LEDs to be used. After the transverse plate 2 is folded two times the right-most and left-most longitudinal piece 21 can be inserted into a circuit board 3. It is obvious that the longitudinal pieces 21 serve as electrical conductive elements, therefore, the longitudinal pieces 21 can be substituted by any other suitable electrical conductive means.

Figure 3B:
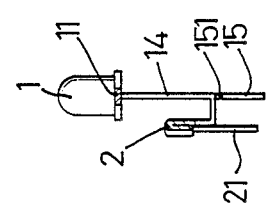
FIG. 3B is a cross-sectional view of the structure taken along line III—III of FIG. 3A.
Figure 3A:
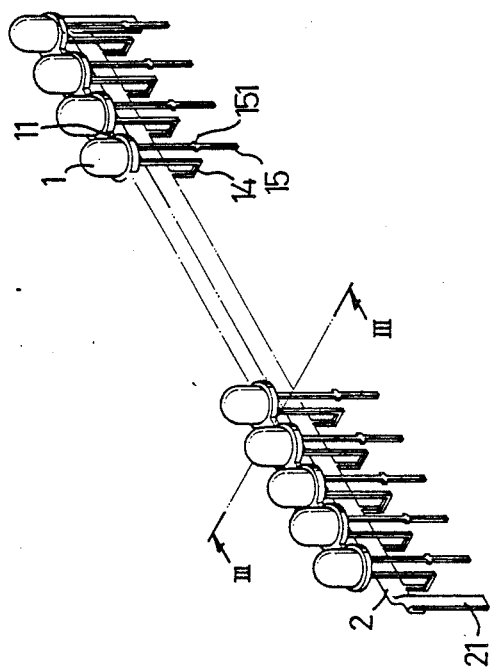
FIG. 3A is a perspective view of the present invention in its final completely folded position.
Figure 4:
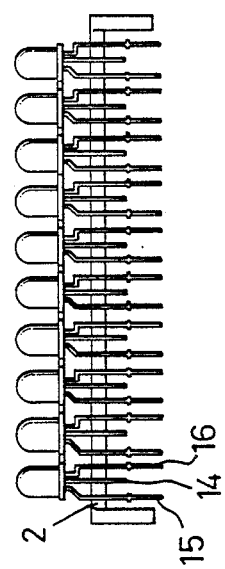
FIG. 4 is a cross-sectional view of the present invention showing another embodiment of the folded leads.

From FIGS. 3A and 3B, it can be clearly seen that the connecting leads 14 of all the LED elements are connected in common line by the transverse plate 2 thus eliminating the need for a lot of connections (approximately one half of the original number) when forming a large LED display. When positioning the LEDs on the circuit board 3, the stop pieces 151 contact the upper surface of the circuit board, so that all the LED elements are positioned at the same level. Further, the LED elements can be easily aligned, therefore, the convergence effect can be greatly increased. Furthermore, the transverse plate 2 also has the effect of securing the LED connections more rigidly to the circuit board 3, shown in FIG. 3A, whereby the large LED displays are formed effectively as well as efficiently.

Figure 6:
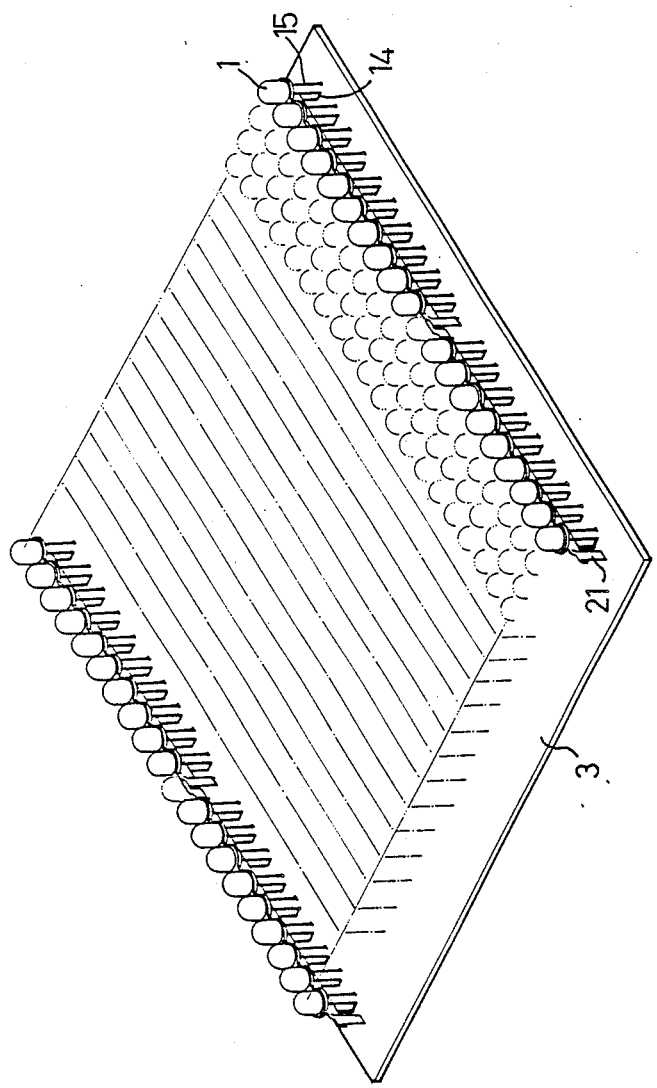
FIG. 6 is a perspective view of a large LED display using the present invention.

It should be noted that the transverse plate 2 will carry all the current flowing into each of the LED elements so that the width of the transverse plate 2 is adequately large enough to carry the current. The transverse plate 2 is further folded, as shown in FIG. 2 or 3A, to decrease the whole height of the structure and increase the strength of the structure. The transverse plate 2 may be folded for one or more times. Please note that each end of the transverse plate 2 can be bent inward or outward, as shown in FIG. 3A, so that two or more string structures can be aligned and overlap with each other, as shown in FIG. 6.

Figure 5A:
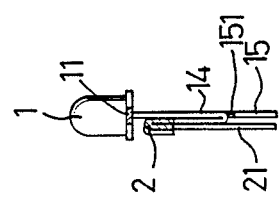
FIGS. 5A and 5B are perspective views of two embodiments of the present invention using transistors as their elements.
Figure 5B:
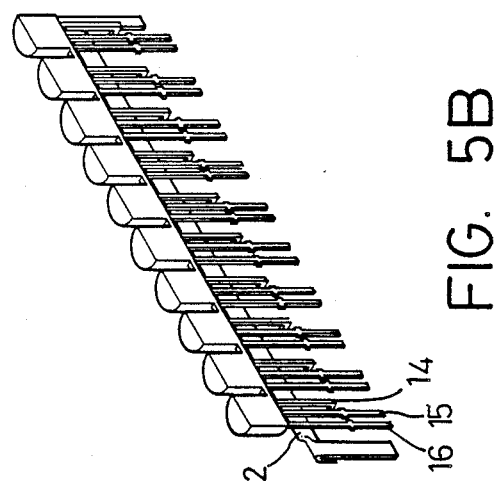

Further, this invention can also be applied to an LED connection structure which contains two LED chips in every encasement and can emit two different colors of light. In this situation there are three connecting leads 14, 15 and 16, as can be seen in FIG. 5A, with the middle connecting lead 14 used as the common line. In addition, this structure can be used with transistors too. As demonstrated in FIG. 5B, the right-most lead of each transistor is bent backwards to connect with a transverse plate 2, thus forming a transistor connection structure.

As can be seen from the above description, this invention provides a semiconductor connection structure which not only greatly reduces the time needed for assembling LEDs into a large display, but also significantly simplifies the design of the circuit board in connection with the large display. That is, the present invention provides the following advantages:

(1) Provides easier and more convenient fabrication than previously possible since a series of the encasements are mounted together in actual use;

(2) Simplifies circuit designs by previously connecting one lead from each encasement for ground lines. This results in reducing the points requiring soldering and reducing the inner connections for the ground lines;

(3) Enhances securement of LED connections on a circuit board, since every encasement is connected together by binding pieces.

(4) Both end portions of the transverse pieces are conductive, so that it is convenient to multiply the amount of the encasements by merely contacting the semiconductor connection structures together with their end portions; and (5) The workable encasements are dismountable for individual replacement from the damaged semiconductor connection structures.

Thus far, it is to be appreciated that the present invention is a significant improvement over the prior art, and further explanation is believed unnecessary. Since various possible embodiments might be made of the above invention without departing from the scope of the invention for example, the light emitting diode may be substituted by transistor. It is to be understood that all matter herein described or shown in the accompanying drawings is to be interpreted as illustrative and not in a limiting sense. Thus it will be appreciated that the drawings are exemplary of a preferred embodiment of the invention and that the scope of the invention is to be limited only by the scope of the appended claims.

I claim:

1. A semiconductor string connection structure comprising:
   a plurality of encasements, each of which encloses a semiconductor chip, and a plurality of conducting leads projecting parallel from one end thereof;
   a transverse plate integral with said plurality of conducting leads and disposed at an end opposite to the encasements;
   a plurality of longitudinal pieces, each longitudinal piece disposed between two pairs of said conducting leads and integral with the transverse plate;
   a plurality of stop pieces, integrally formed with the conducting leads and disposed at a midpoint of the conducting leads;
   a plurality of binding pieces integrally formed with the disposed between each encasement;
   a plurality of transverse thin pieces, integral with the conducting leads and/or the longitudinal pieces and disposed between the conducting leads and longitudinal pieces; and
   a plurality of positioning holes uniformly disposed along a length of the transverse piece.

2. A semiconductor string connection structure as set forth in claim 1, wherein:
   the transverse thin pieces are cut away after fabrication;
   the binding pieces are cut away after fabrication;
   the conducting leads not intended to be collectively connected are separated from the transverse plate;
   the conducting leads attached to the transverse plate are folded 90 degrees twice, such that respective free ends of the longitudinal pieces are directed in a same direction as the free ends of said separated conducting leads;
   a plurality of longitudinal pieces are cut away after fabrication; and
   the lead frame is separable into various lengths.

3. A semiconductor string connection structure as in claim 1, wherein said encasement encloses more than one semiconductor chip and an additional conducting lead is provided for each additional semiconductor chip.

4. A semiconductor string connection structure as in claim 1, wherein said transverse plate is of sufficient width to adequately conduct the total electrical current required for all the semiconductor chips.

5. A semiconductor string connection structure as in claim 1, wherein the transverse plate is folded 180 degrees along a line perpendicular to the conducting leads and midway along the width of said transverse plate.

* * * * *